United States Patent [19]

Takasaki

[11] Patent Number: 5,210,052
[45] Date of Patent: May 11, 1993

[54] METHOD FOR FABRICATING A SEMICONDUCTOR SUBSTRATE

[75] Inventor: Kanetake Takasaki, Tokyo, Japan

[73] Assignee: Fujitsu Limited, Kawasaki, Japan

[21] Appl. No.: 884,284

[22] Filed: May 13, 1992

Related U.S. Application Data

[63] Continuation of Ser. No. 525,057, May 18, 1990, abandoned.

[30] Foreign Application Priority Data

May 18, 1989 [JP] Japan .................................. 1-125104

[51] Int. Cl.$^5$ .............................................. H01L 21/20
[52] U.S. Cl. .................................... 437/132; 437/247; 437/976
[58] Field of Search .............. 148/DIG. 97; 437/976, 437/132

[56] References Cited

U.S. PATENT DOCUMENTS

| | | | |
|---|---|---|---|
| 4,477,311 | 10/1984 | Mimura et al. | 437/105 |
| 4,632,712 | 12/1986 | Fan et al. | 437/132 |
| 4,634,474 | 1/1987 | Camlibel et al. | 437/247 |
| 4,713,354 | 12/1987 | Egawa et al. | 437/247 |
| 4,743,569 | 5/1988 | Plumton et al. | 437/247 |
| 4,835,116 | 5/1989 | Lee et al. | 437/132 |
| 4,897,367 | 1/1990 | Ogasawara | 437/132 |

OTHER PUBLICATIONS

Ohmachi et al., "High Quality GaAs on Si and its Application to a Solar Cell", Mat. Res. Soc. Symp. Proc., vol. 144, 1989, pp. 297-302.
Okamoto et al., "Dislocation Reduction in GaAs on Si by Thermal Cycles ... ", Jpnse. J. Appl. Phys., vol. 26, No. 12, Dec. 1987, pp. L1950-L1952.
Kohama et al., "Heteroepitoxy of InPan Si Substrates by MOCVD", J. Electrochem. Soc., vol. 136, No. 12, Dec. 1989, pp. 3853-3856.
Chan et al., "Thermal Annealing Study on GaAs ... ", J. Appl. Phys., 58(1), 1 Jul. 1985, pp. 545-549.
Ito et al.: "A comparison of deep levels in rapidly thermal-processed GaAs films grown by molecular beam epitaxy on Si and GaAs substrates", Semiconductor Science and Technology, vol. 4, May 1989, pp. 416-419, IOP Publishing Ltd., London, GB.

Primary Examiner—Olik Chaudhuri
Assistant Examiner—Ramamohan R. Paladugu
Attorney, Agent, or Firm—Staas & Halsey

[57] ABSTRACT

A method for fabricating a heteroepitaxial semiconductor substrate body used as a substrate of a compound semiconductor device. The heteroepitaxial semiconductor substrate body comprises a semiconductor substrate of a first semiconductor material and an epitaxial layer of a second semiconductor material grown heteroepitaxially on the semiconductor substrate. The method comprises steps of growing the epitaxial layer on the semiconductor substrate heteroepitaxially to form the heteroepitaxial semiconductor substrate body, depositing a stress inducing layer on a top surface of the epitaxial layer so as to induce a stress in the epitaxial layer, applying a cyclic annealing process for repeatedly and alternately holding the heteroepitaxial substrate body including the stress inducing layer deposited on the epitaxial layer at a first temperature and at a second temperature lower than the first temperature, and removing the stress inducing layer from the top surface of the epitaxial layer.

9 Claims, 3 Drawing Sheets ately reduced without increasing the thickness of the heteroepitaxial substrate layer.

METHOD FOR FABRICATING A SEMICONDUCTOR SUBSTRATE

This application is a continuation of application Ser. No. 07/525,057, filed May 18, 1990, now abandoned.

BACKGROUND OF THE INVENTION

1. Field of the Invention

The present invention relates in general to fabrication of semiconductor devices and more particularly to a method for fabricating a substrate structure comprising an epitaxial layer of a compound semiconductor material grown heteroepitaxially on a semiconductor wafer.

2. Description of the Related Art

Semiconductor devices fabricated on the substrate of compound semiconductors such as gallium arsenide (GaAs) have excellent operational characteristics such as high operational speed because of the high electron mobility pertinent to the compound semiconductors. Thus, various integrated circuits are constructed using the compound semiconductor material as the substrate.

As the substrate of such a compound semiconductor integrated circuits, the use of a single crystal wafer of a compound semiconductor material such as GaAs is of course possible. However, the fabrication of a large diameter GaAs wafer is currently difficult and expensive, because of the difficulty in growing a GaAs ingot without substantial defects or dislocations therein, difficulty of handling a large diameter GaAs wafer due to the brittle nature of GaAs, and the like. Because of this, attempts are made to grow a thin substrate layer of single crystal GaAs heteroepitaxially on a wafer of silicon which can be fabricated by a well established process even when the diameter of the wafer is increased.

Using the currently available technique, the heteroepitaxial growth of GaAs on silicon itself can be made without difficulty. However, the process for growing a single crystal GaAs layer on silicon with a quality which is suitable for use as the substrate of the compound semiconductor devices or integrated circuits, is still not established and intensive efforts are made for growing a GaAs substrate layer on a silicon wafer with such a quality that the dislocation density of about $10^6$ cm$^{-2}$ or less is achieved.

The reason why the dislocations are introduced into the GaAs substrate layer when it is grown on the silicon substrate heteroepitaxially, is attributed to the large difference in the lattice constant and the thermal expansion between these two materials. It should be noted that the lattice constant of GaAs is larger than that of silicon by about 4%. Thus, crystal lattices of the two materials cause a slip or discrepancy at the interface between the silicon wafer and the GaAs substrate layer, and these discrepancies are propagated towards the surface of the GaAs substrate layer as dislocations.

In order to prevent the propagation of the dislocations into the interior of the GaAs substrate layer, a process of cyclic annealing is proposed. According to this process, a GaAs substrate layer is grown heteroepitaxially on a silicon wafer at about 800° C. at first, and the temperature at which the wafer and the substrate are held is increased and decreased repeatedly between 850° C. and 550° C. When such a cyclic process is applied, tensile stresses and compressive stresses appear alternately in the GaAs substrate layer, and the dislocations are moved within the GaAs substrate layer in response to the stresses thus induced. During the movement of the dislocations, there occurs a case wherein two dislocations meet each other. When such a meeting or intersection of the dislocations occurs, there is a chance that the discrepancy of the crystal lattice causing the dislocations are cancelled each other. Thereby, a closed loop of dislocation is formed in the GaAs substrate and further propagation of the dislocations in the GaAs substrate layer towards its top surface is prevented.

FIG.1A shows a typical heteroepitaxial substrate structure 10 for use as the substrate of the compound semiconductor material. The substrate structure comprises a silicon wafer 11 and a GaAs heteroepitaxial substrate layer 12 grown thereon. In this structure, there are formed a number of slips or discrepancy of the crystal lattice in correspondence to the interface between the silicon wafer 11 and the GaAs layer 12, and a number of dislocations 14 are nucleated from this interface. These dislocations 14 extend in the GaAs crystal forming the layer 12 along the [101] direction and can move freely either in the [011] or [0$\bar{1}$1] direction within the (11$\bar{1}$) plane of the GaAs crystal. Some of the dislocations 14 extend throughout the GaAs layer 12 and reaches its top surface. It should be noted that the top surface of the GaAs heteroepitaxial substrate layer 12 is defined by the (100) surface and the dislocations move somewhat perpendicularly with respect to the sheet of FIG. 1A.

When the structure shown in FIG. 1A is subjected to a cyclic annealing process as described, it is thought that each of the dislocations is moved in one of the [011] and [0$\bar{1}$1] directions, and when two dislocations meet each other during the movement, there arises a case wherein the discrepancy of the crystal lattice causing the dislocations is cancelled each other. Thereby a loop 14' of dislocation is formed at the interface such that the loop 14' extends into the substrate layer 12 and returns again to the interface as shown in FIG. 1B. When such a loop is formed, further propagation of the dislocations 14 toward the top surface of the heteroepitaxial substrate layer 12 is prevented and the dislocation density in the vicinity of the top surface of the heteroepitaxial substrate layer 12 is significantly reduced. The dislocations formed in the silicon wafer 11 are not important with respect to the object of the present invention and will not be considered any further.

In the actual semiconductor devices, another GaAs layer not illustrated is grown further on the heteroepitaxial GaAs layer 12 as the substrate layer for decreasing the dislocation density in the substrate layer further. In this case, the GaAs layer 12 acts as the buffer layer.

In such a prior art cyclic annealing process, however, the dislocation density cannot be reduced below 6–7 × 10$^6$ cm$^{-2}$ as shown in FIG. 2 even with the cyclic annealing repeated more than five times. Such a decrease of the dislocation density is unsatisfactory because a dislocation density of less than 10$^6$ cm$^{-2}$ is required for the substrate layer 12 when constructing a semiconductor device thereon.

SUMMARY OF THE INVENTION

Accordingly, it is a general object of the present invention to provide a novel and useful process for fabricating a heteroepitaxial semiconductor substrate structure comprising a substrate of a semiconductor material and an epitaxial substrate layer of a compound semiconductor material grown heteroepitaxially thereon, wherein the foregoing problems are eliminated.

Another and more specific object of the present invention is to provide a process for fabricating a heteroepitaxial semiconductor substrate structure comprising a substrate of a semiconductor material and an epitaxial substrate layer of a compound semiconductor material grown heteroepitaxially thereon, wherein the dislocation density in the epitaxial substrate layer is decreased effectively by a cyclic annealing process.

Another object of the present invention is to provide a process for fabricating a heteroepitaxial semiconductor substrate body used as a substrate of a compound semiconductor device, said heteroepitaxial semiconductor substrate body comprising a substrate of a first semiconductor material and an epitaxial layer of a second semiconductor material grown heteroepitaxially thereon, said process comprising steps of growing the epitaxial layer on the substrate heteroepitaxially to form the heteroepitaxial substrate body, depositing a stress inducing layer on a top surface of the epitaxial layer so as to induce a stress in the epitaxial layer, applying a cyclic annealing process to the heteroepitaxial semiconductor substrate body for repeatedly and alternately holding the heteroepitaxial substrate body including the stress inducing layer deposited on the epitaxial layer at a first temperature and at a second temperature lower than the first temperature, so that the dislocations formed at a boundary between the substrate and the epitaxial layer form loops of dislocations such that each of the dislocations forming a loop extends from the boundary towards the epitaxial layer and returns to the boundary without reaching the top surface of the epitaxial layer, and removing the stress inducing layer from the epitaxial layer after the step of applying the cyclic annealing is completed. According to the present invention, it was found that the dislocation density in the heteroepitaxial substrate layer is decreased below $10^6/cm^2$ after only a few cycles of annealing. This level of dislocation density could not be achieved in the conventional process even after repetition of the cyclic annealing process for a number of times.

DESCRIPTION OF THE PREFERRED EMBODIMENT

First, the principle of the present invention, which is thought to be a probable mechanism for reducing the dislocation density, will be described.

As already described, the crystal of GaAs contains dislocations which extend in the <110> direction and move freely in the {111} plane. It is known that the moving speed of the dislocations is represented as $$v = C\sigma \cdot exp(-E_0/kT) \tag{1}$$

where C is a proportional constant, $\sigma$ stands for the stress in the epitaxial substrate layer, and $E_0$ stands for the activation energy of movement of the dislocations.

Figure 1A:
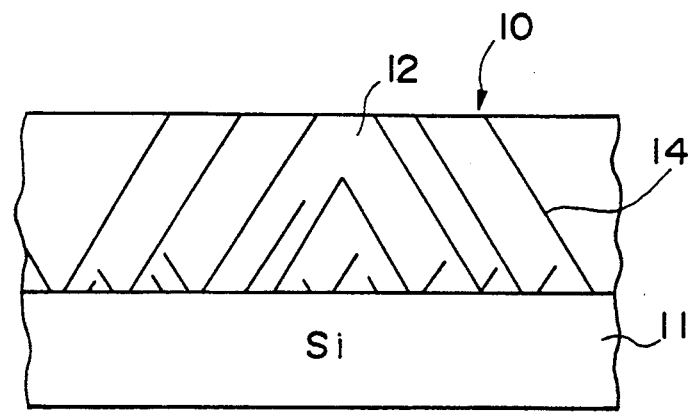
FIGS. 1A and 1B are diagrams showing the dislocations formed in a conventional heteroepitaxial substrate structure comprising a silicon substrate and a heteroepitaxial substrate layer of a compound semiconductor material grown on the silicon substrate heteroepitaxially.
Figure 1B:
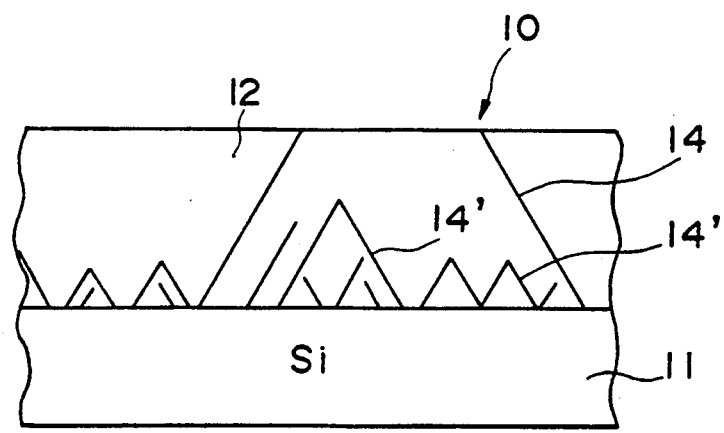

In the heteroepitaxial substrate structure shown in FIGS. 1A and 1B, the stress is caused as a result of the difference between the silicon single crystal substrate 11 and the heteroepitaxial substrate layer 12 grown thereon. Thus, the temperature dependence of the stress in such a structure is represented as $$\sigma = C'(T_s - T) \tag{2}$$

wherein $T_s$ stands for the temperature of growth of the epitaxial substrate layer. It should be noted that the stress becomes zero when the heteroepitaxial substrate structure is held at a temperature identical to the temperature at which the growth of the heteroepitaxial substrate layer was made.

Combining Eq. (1) and (2), the moving speed of the dislocations in the heteroepitaxial substrate layer is represented as $$v = K(T_s - T) \cdot exp(-E_0/kT) \tag{3}$$

where K is a constant.

Figure 3:
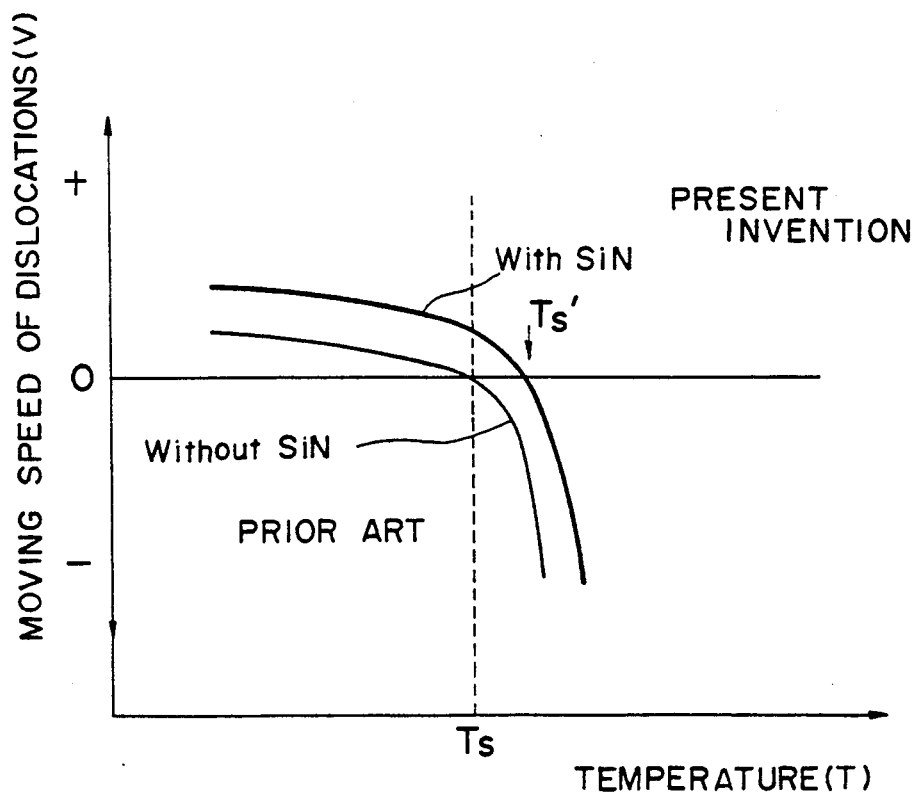
FIG. 3 is a graph showing the relation between the moving speed of the dislocations in the heteroepitaxial substrate layer and the temperature used in the cyclic annealing process.

FIG. 3 shows the moving speed of the dislocations given by Eq. (3) graphically as a function of the temperature.

As can be seen in FIG. 3, each of the dislocations, moving in the (11$\bar{1}$) plane of GaAs, moves either in the [011] direction or [0$\bar{1}$1] direction with an increase of the temperature beyond the temperature $T_s$, while the dislocations move in another, opposite direction [01$\bar{1}$] or [0$\bar{1}\bar{1}$] with a decrease of the temperature below the temperature $T_s$. The speed of movement of the dislocations is increased with the increase or decrease of the temperature from the foregoing temperature $T_s$.

Figure 2:
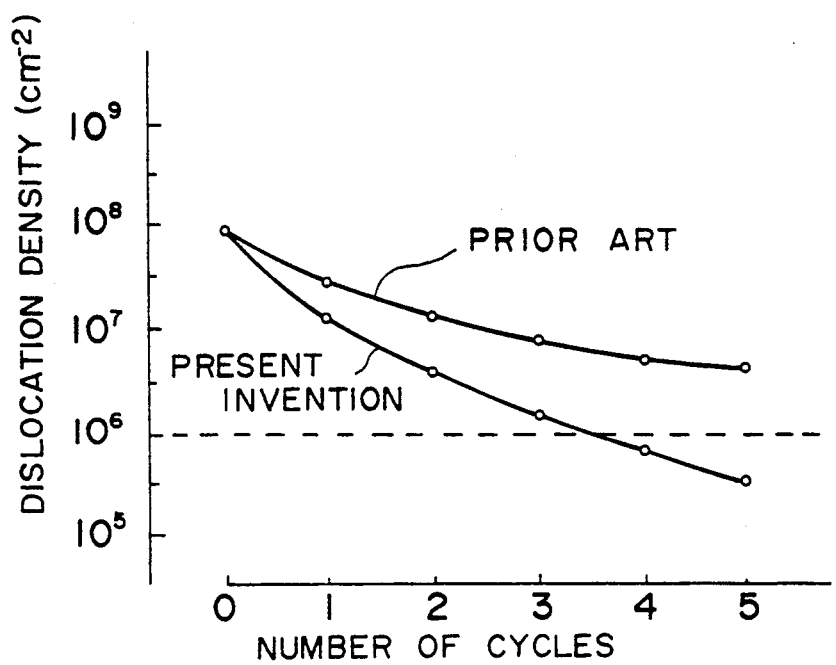
FIG. 2 is a graph showing the effect of reduction of the dislocation density in the structure shown in FIGS. 1A and 1B by the cyclic annealing process of the present invention in comparison with the prior art cyclic annealing process.

In the case of a curve designated as "PRIOR ART" in FIG. 3 which corresponds to the case of FIGS. 1A and 1B, each of the dislocations moves with a substantial speed in either the first direction [01$\bar{1}$] or second direction [0$\bar{1}\bar{1}$] when the temperature is increased above $T_s$ by the cyclic annealing process, while when the temperature is reduced below the foregoing temperature $T_s$, the same dislocation moves little in the opposite direction. In other words, the number or proportion of the dislocations moving with a substantial speed is relatively small in the conventional cyclic annealing process particularly when the temperature is reduced below the temperature $T_s$ during the cyclic annealing process. It is thought that this is the reason why the dislocation density could not be reduced below $10^6/cm^2$ by the conventional cyclic annealing process as shown in FIG. 2 by the curve "PRIOR ART".

In the present invention, means is provided on the substrate structure of FIGS. 1A and 1B such that the curve of FIG. 3 is shifted upwards as shown by a curve "PRESENT INVENTION". In other words, the moving speed of the dislocations is enhanced in the temperature region below the temperature $T_s$ by shifting the curve "PRIOR ART" upwards. Such a shift may be obtained by increasing the stress applied to the epitaxial substrate layer 12. For example, when an additional stress $\sigma_0$ is applied to the epitaxial substrate layer 12, the moving speed of the dislocations is now represented by the following equation $$v' = [K(T_s - T) + \sigma] \cdot \exp(-E_0/kT) \qquad (4)$$

The relation represented by Eq. (4) is represented in FIG. 3 by a curve designated as "PRESENT INVENTION". As is clearly seen in this second curve, the temperature at which the moving speed of the dislocations becomes zero is shifted slightly upwards to a temperature $T_s'$, and associated therewith, the moving speed of the dislocations in the temperature region above the temperature $T_s$ is decreased slightly. However, as the speed of movement of the dislocations increases exponentially when the temperature exceeds $T_s$, such a slight decrease does not cause any substantial problem.

As the speed of movement of the dislocations is increased even when the temperature is decreased at the time of the cyclic annealing, the chance that the loop of the dislocations is formed in response to the cyclic annealing is substantially increased, and it is expected that the dislocation density at the top surface of the epitaxial substrate layer 12 is reduced significantly.

Figure 4:
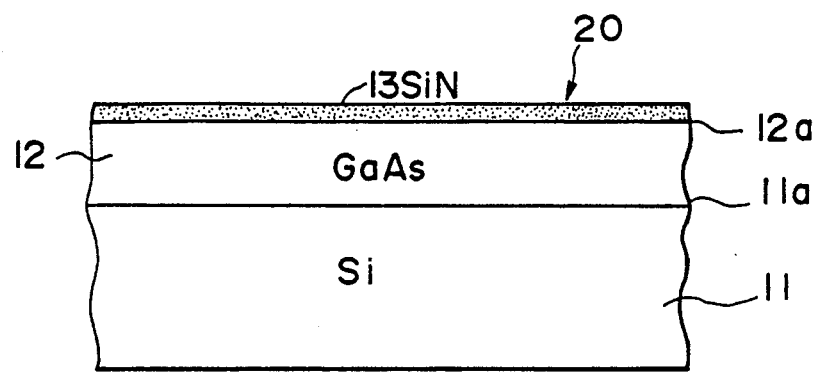
FIG. 4 is a diagram showing a heteroepitaxial substrate structure used in the present invention for reducing the dislocations from the heteroepitaxial substrate layer therein.

FIG. 4 shows a heteroepitaxial substrate structure 20 according to a first embodiment of the present invention for enhancing the effect of decreasing the dislocation density in the GaAs epitaxial substrate layer 12. In the drawing, the parts corresponding to those parts already described with reference to FIGS. 1A and 1B are given identical reference numerals and the description thereof will be omitted.

In this embodiment, the GaAs epitaxial substrate layer 12 is grown epitaxially on a (100) surface 11a of the silicon wafer 11 for a thickness of about 3 um by a metal-organic chemical vapor deposition (MOCVD) process using trimethylgallium (TMG) and arsine (AsH$_3$) as the source materials. The growth of the layer 12 may be made at 700° C. under a pressure of 76 Torr. Next, the silicon nitride film 13 is deposited on a top surface 12a of the GaAs epitaxial substrate layer 12 for a thickness of 500–2500 Å wherein a thickness of about 1000 Å is preferred. The deposition may be made by a chemical vapor deposition (CVD) process using a mixture of silane (SiH$_4$) and ammonia (NH$_3$) with a ratio of 1:30 at a temperature of 750° C. under a pressure of 1.0 Torr. A carrier gas of N$_2$ may be used in this process. The silicon nitride film 13 thus deposited has a composition generally represented as SiN$_x$ and develops a tensile stress therein as will be described later. This material will be designated hereinafter as SiN and the layer 13 will be referred to as the stress inducing layer. It should be noted that the step of growing the silicon nitride film 13 can be made consecutively after the step of growing the GaAs epitaxial substrate layer 12, by using an apparatus which is the same as the apparatus used for growing the layer 12.

Next, the heteroepitaxial substrate structure 20, which comprises the silicon wafer 11, epitaxial substrate layer 12 and the SiN stress inducing layer 13, is subjected to a cyclic annealing process wherein the temperature for holding the substrate structure is increased and decreased repeatedly between the highest temperature which is set to be 850° C. or more and the lowest temperature which is set to be 550° C. or less. Preferably, this cyclic annealing process is performed in an atmosphere containing AsH$_3$. It should be noted that the highest temperature of the cyclic annealing is set higher than the temperature of deposition of the SiN stress inducing layer 13 and that the lowest temperature of the cyclic annealing is set lower then the temperature of growth of the GaAs epitaxial substrate layer 12. In each cycle of the annealing, the substrate structure is held at the highest temperature and at the lowest temperature respectively for about 5 minutes. The duration of each cycle may be set to about 30 minutes.

It should be noted that the foregoing processes of growing the GaAs epitaxial substrate layer 12 on the silicon substrate 11, providing the stress inducing layer 13, and applying the cyclic annealing, can be carried out in a same CVD or other apparatus used commonly for crystal growth. By doing so, one can decrease the number of steps of fabricating the heteroepitaxial substrate structure and at the same time reduce the chance that the defective product is obtained because of the contamination which may be caused when the foregoing steps are performed in different apparatus.

After the cyclic annealing process, the SiN stress inducing layer 13 is removed by etching using a phosphoric acid (H$_3$PO$_4$) solution, and the top part of the GaAs epitaxial layer 12 which may have been damaged as a result of the contact with the SiN stress inducing layer 13 is removed for a thickness of about 3000 Å by a wet etching process using an etching solution of sulfuric acid (H$_2$SO$_4$), hydrogen peroxide (H$_2$O$_2$) and water (H$_2$O).

In the foregoing process, the SiN stress inducing layer 13 when deposited the GaAs epitaxial substrate layer 12, shrinks as it is deposited, and thereby a large tensile stress is developed therein. In response to this, the stress inducing layer 13 applies a large compressive stress to the epitaxial substrate layer 12. The layer 12 also experiences a stress from the underlying silicon wafer 11. In all, a stress of about $1.7 \times 10^8 - 1.7 \times 10^9$ dyn/cm$^2$ is induced in the epitaxial substrate layer 12 when it is held at 700° C. which is the central temperature of the cyclic annealing. It should be noted that the temperature of 700° C. coincides also to the temperature of growth of the epitaxial substrate layer 12. Thus, at this temperature, there is no substantial contribution to the stress in the epitaxial substrate layer 12 from the silicon wafer 11. In other words, the foregoing stress of about $1.7 \times 10^8 - 1.7 \times 10^9$ dyn/cm$^2$ corresponds to the stress $\sigma_0$ of Eq. (4). The stress induced by the layer 13 is substantially independent of the temperature.

In FIG. 2, the result of dislocation density measurement for the substrate structure thus obtained is illustrated by a curve designated as "PRESENT INVENTION". It is clearly seen that the dislocation density measured in the GaAs epitaxial substrate layer 12 is decreased below $10^6$/cm$^2$ after a repetition of the cyclic annealing for four times. This level of dislocation density is satisfactory for fabricating a semiconductor device thereon.

The following table summarizes the value of the stresses induced in the GaAs epitaxial substrate layer 12 when various materials are used as the stress inducing layer 13.

TABLE I

| material | thickness (Å) | stress (depends on thickness) dyn/cm$^2$ |
|---|---|---|
| SiN | 500–5000 | $1.7 \times 10^8 - 1.7 \times 10^9$ |
| AlN | 1000 | $1 \times 10^6$ |
| SiO$_2$ | 1000 | $1.8 \times 10^7$ |
| GaP | 1000 | $1.0 \times 10^6$ |

From TABLE I, it is recognized that the group III–V materials such as AlN or GaP generally induce too small of a stress in the GaAs epitaxial substrate layer and are not suitable for the layer 13 for applying the desired the stress. On the other hand, it is recognized that SiO$_2$ is a material effective for the stress inducing layer 13. Further, oxynitrides such as SiON is identified to be a material effective to induce the desired stress in the epitaxial substrate layer when used as the stress inducing layer 13.

Figure 5:
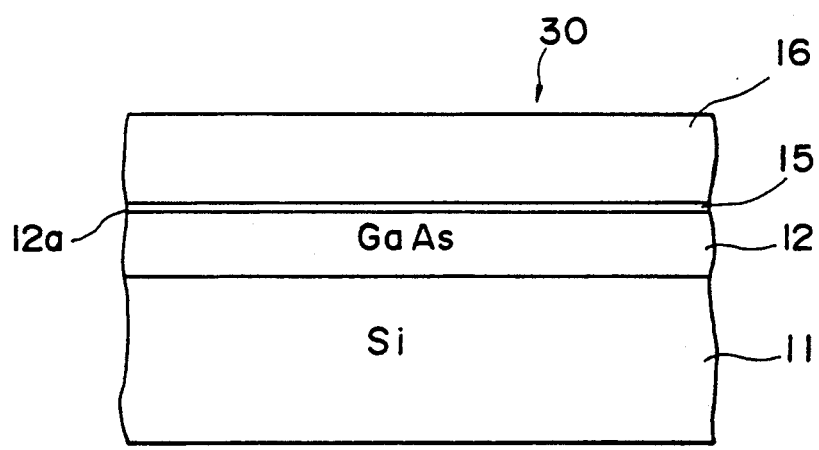
FIG. 5 is a diagram showing a second embodiment of the present invention.

FIG. 5 shows another heteroepitaxial substrate structure 30 according to a second embodiment of the present invention. In FIG. 5, the parts already described with reference to preceding drawings are given identical reference numerals and the description thereof will be omitted.

In this embodiment, the stress inducing layer 13 is removed from the structure 20 after the cyclic annealing process as described, and after the foregoing process of removing the top part of the substrate layer 12 by etching, a buffer layer 15 comprising a strained super lattice structure 15 of compound semiconductors such as InGaAs, GaAs, and the like is formed on the top surface 12a of the layer 12, and a second substrate layer 16 of GaAs acting as the actual substrate of the device is grown further thereon. According to this construction, propagation of the dislocations remaining on the surface 12a of the GaAs layer 12 into the second substrate layer 16 is prevented by the strained super lattice layer 15, and the dislocation density in the second substrate layer 16 is reduced further.

Further, the present invention is not limited to these embodiments described heretofore, but various variations and modifications may be made without departing from the scope of the invention.

What is claimed is:

1. A method for fabricating a heteroepitaxial semiconductor substrate used as a substrate of a compound semiconductor device, said heteroepitaxial semiconductor substrate comprising a substrate of a first semiconductor material and an epitaxial layer of a second semiconductor material grown heteroepitaxially on said substrate of said first semiconductor material, said method comprising steps of:

growing the epitaxial layer on the substrate of the first semiconductor material heteroepitaxially to form a heteroepitaxial semiconductor substrate body;

depositing a stress inducing layer on a top surface of the epitaxial layer so as to induce a stress in the epitaxial layer;

applying a cyclic annealing process to the heteroepitaxial semiconductor substrate body for repeatedly and alternately holding the heteroepitaxial semiconductor substrate body including the stress inducing layer deposited on the epitaxial layer at a first temperature and at a second temperature lower than the first temperature while applying said stress to the epitaxial layer by the stress inducing layer; and removing the stress inducing layer from the epitaxial layer after the step of applying the cyclic annealing is completed.

2. A method as claimed in claim 1 in which said substrate of said first semiconductor material comprises silicon and said epitaxial layer comprises gallium arsenide grown on the silicon substrate under a third temperature which is smaller than the first temperature but larger than the second temperature.

3. A method as claimed in claim 1 in which said stress inducing layer comprises a material selected from silicon nitride, silicon oxide and silicon oxynitride.

4. A method as claimed in claim 1 in which said first temperature is set to be about 850° C. or more while said second temperature is set to be about 550° C. or less.

5. A method as claimed in claim 1 in which said step of applying the cyclic annealing process is performed under an atmosphere containing arsine.

6. A method as claimed in claim 1 in which said method further comprises steps of removing the stress inducing layer after the step of applying the cyclic annealing process and removing a part of the epitaxial layer after the step of removing the stress inducing layer, said part of the epitaxial layer including a region of the epitaxial layer wherein defects have been introduced as a result of a contact to the stress inducing layer.

7. A method as claimed in claim 6 in which said step of removing the part of the epitaxial layer after the step of removing the stress inducing layer comprises a step of etching the epitaxial layer for about 3000 Å.

8. A method as claimed in claim 1 in which said step of growing the epitaxial layer, said step of depositing the stress inducing layer and said step of applying the cyclic annealing process are performed in a same apparatus.

9. A method for fabricating a heteroepitaxial semiconductor substrate used as a substrate of a compound semiconductor device, said heteroepitaxial semiconductor substrate comprising a substrate of a first semiconductor material and an epitaxial layer of a second semiconductor material grown heteroepitaxially on said substrate of said first semiconductor material, said method comprising steps of:

growing the epitaxial layer on the substrate of the first semiconductor material heteroepitaxially to form a heteroepitaxial semiconductor substrate body;

depositing a stress inducing layer on a top surface of the epitaxial layer so as to induce a stress of at least $1.7 \times 10^8$ dyn/cm$^2$ in the epitaxial layer;

applying a cyclic annealing process to the heteroepitaxial semiconductor substrate body for repeatedly and alternately holding the heteroepitaxial semiconductor substrate body including the stress inducing layer deposited on the epitaxial layer at a first temperature and at a second temperature lower than the first temperature while applying said stress to the epitaxial layer by the stress inducing layer; and removing the stress inducing layer from the epitaxial layer after the step of applying the cyclic annealing is completed.

* * * * *